US009460240B2

United States Patent
Hassel et al.

(10) Patent No.: US 9,460,240 B2
(45) Date of Patent: Oct. 4, 2016

(54) METHOD FOR DETERMINING A PARTIAL-LOAD CONDITION OF A SYSTEM

(71) Applicant: Siemens Aktiengesellschaft, Munich (DE)

(72) Inventors: Jörg Hassel, Erlangen (DE); Jörg Neidig, Nürnberg (DE); Michael Pirker, Munich (DE); Christian Seitz, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 484 days.

(21) Appl. No.: 13/628,723

(22) Filed: Sep. 27, 2012

(65) Prior Publication Data

US 2013/0124179 A1 May 16, 2013

(30) Foreign Application Priority Data

Sep. 29, 2011 (EP) .................................... 11183290

(51) Int. Cl.
*G06G 7/48* (2006.01)
*G06F 17/50* (2006.01)
(Continued)

(52) U.S. Cl.
CPC ........... *G06F 17/5009* (2013.01); *G05B 17/02* (2013.01); *G05B 19/41865* (2013.01);
(Continued)

(58) Field of Classification Search
CPC ............... G06F 17/5009; G05B 17/02; G05B 19/41865; G05B 2219/32021; Y02P 70/161; Y02P 90/20; Y02P 90/205; Y02P 90/26; Y02P 90/10
USPC ........................................................... 703/7
See application file for complete search history.

(56) References Cited

U.S. PATENT DOCUMENTS 7,286,916 B2 * 10/2007 Hoeflacher ......... B60R 16/0234
340/457.4
7,343,353 B1 3/2008 Wu et al.
(Continued)

FOREIGN PATENT DOCUMENTS

| CN | 201463177 | 5/2010 |
| CN | 101782261 | 7/2010 |
| EP | 1564629 | 8/2005 |

OTHER PUBLICATIONS

Alexander Verl et al., "Architecture of multilevel monitoring and control of energy consumption," May 2, 2011, Proceedings of the 18th CIRP International Conference on Life Cycle Engineering, pp. 347-352.*

(Continued)

*Primary Examiner* — Kamini S Shah
*Assistant Examiner* — Russ Guill
(74) *Attorney, Agent, or Firm* — Cozen O'Connor

(57) ABSTRACT

A method for evaluating component-related energy models and external specification parameters, in order, based on these, to produce a determination of a set of partial-load conditions, which are simulated based on a parameterizable simulation model of the system. A system planner is put in a position, with the specification of specification parameters, for example, a minimum throughput of the system or a maximum energy consumption, in which he can obtain a set of partial-load conditions, i.e., a partial-load condition for each of the components involved in the determination. In this way, an individual partial-load condition can be set for each component, where all the partial-load conditions fulfill the provisions of the specification parameters.

14 Claims, 2 Drawing Sheets

(51) Int. Cl.
*G05B 17/02* (2006.01)
*G05B 19/418* (2006.01)

(52) U.S. Cl.
CPC .... *G05B2219/32021* (2013.01); *Y02P 70/161* (2015.11); *Y02P 90/10* (2015.11); *Y02P 90/20* (2015.11); *Y02P 90/205* (2015.11); *Y02P 90/26* (2015.11)

(56) References Cited

U.S. PATENT DOCUMENTS

| 8,401,726 | B2 * | 3/2013 | Bouvier | G06Q 10/00 |
|---|---|---|---|---|
| | | | | 701/29.1 |
| 2002/0143497 | A1 | 10/2002 | Roser et al. | |
| 2003/0050817 | A1 | 3/2003 | Cargille et al. | |
| 2003/0159123 | A1 | 8/2003 | Funke et al. | |
| 2010/0087963 | A1 | 4/2010 | Boston et al. | |
| 2010/0274377 | A1 * | 10/2010 | Kaufman et al. | 700/103 |

OTHER PUBLICATIONS

Anton Dietmair et al., "Predictive simulation for model based energy consumption optimization in manufacturing system and machine control," 2009, 19th International Conference on Flexible Automation and Intelligent Manufacturing 2009, pp. 226-233.*

Christoph Hermann et al., "Process chain simulation to foster energy efficiency in manufacturing," 2009, CIRP Journal of Manufacturing Science and Technology, vol. 1, pp. 221-229.*

Joost R. Duflou et al., "Towards energy and resource efficient manufacturing: a processes and systems approach," 2012, CIRP Annals—Manufacturing Technology, vol. 61, pp. 587-609.*

Zeyi Sun et al., "Energy consumption reduction for sustainable manufacturing systems considering machines with multiple power states," Jun. 13, 2011, Proceedings of the ASME 2011 International Manufacturing Science and Engineering Conference, pp. 1-5.*

Anton Dietmair et al., "Energy efficiency optimization in production planning and control," 2010, 20th International Conference on Flexible Automation and Intelligent Manufacturing 2010, pp. 256-263.*

Holger Haag et al., "Planning and Optimization of Energy Consumption in Factories Considering the Peripheral Systems," 2011, In: Spath, D., Ilg, R., Krause, T., Fraunhofer IAO: Innovation in Product and Production: 21st International Conference on Production Research, Stuttgart, Germany, four pages.*

"Bernard & Company's Blog," Mar. 30, 2010, https://bernardandcompany.wordpress.com/2010/03/30/siemens-industry-leader-speaks-about-energy-management-with-drive-systems, two pages.*

* cited by examiner

METHOD FOR DETERMINING A PARTIAL-LOAD CONDITION OF A SYSTEM

BACKGROUND OF THE INVENTION

1. Field of the Invention

The invention relates to a method for determining a partial-load condition of a system comprising several components, a computer program product, and the use of such an overall system partial-load condition.

2. Description of the Related Art

Conventional systems, i.e., production and manufacturing systems, are at present usually operated at full load, or are completely switched off. In the event of the system being only partially utilized, incurred, for example, due to the circumstances of a particular order, it would be advantageous, not least with regard to energy consumption of the system, to operate the system in a partial-load operational mode.

In addition to the energy advantage referred to, other circumstances, i.e., maintenance intervals and service life of individual components, favor the operation of a system in a partial-load condition, instead of operating the system for a specific time under full load and thereafter having the system in a state of rest.

If it is intended that a complete system is to be operated in a specific partial-load condition then the individual components of this system must naturally be operated in an individual partial-load condition. The term "components" is to be understood to mean, for example, processing devices or robots of a manufacturing line, and also facilities such as conveyor belts and motors, which are frequently provided with an at least minimal electronic control and a more or less significant communications interface for the exchange of process and operational data.

With the operation of individual components of the system in a partial-load condition, it is to be borne in mind that, on the one hand, certain components do not allow for every partial-load condition at will, and that, moreover, possible or permissible partial-load conditions of individual components do not have the same effect on the system. For example, a motor can be operated at 25% of a full capacity provided for, while the machine downstream thereof may only be capable of operation at 50%.

Another problem lies in the fact that the operation of all the components of the system in a specific partial-load condition, such as 50% of the full capacity provided for, has different effects on different components. For example, a partial-load condition of 50% on a first component may have a different effect on its throughput than on a second component. The relationship between partial-load conditions of a component and operating parameters such as the throughput as referred to heretofore, is at present not defined either for individual components or for the system as a whole. Even if a definition were to be available for individual components, a system planner would still be confronted by the problem of realizing an implementation of at least one partial-load condition in a complete system which, due to the differing forms of behavior of individual components, represents an extremely complex problem.

SUMMARY OF THE INVENTION

It is therefore an object of the invention to provide a method for determining a partial-load condition for a system comprising several components.

This and other objects are achieved in accordance with the invention by a method, and computer program, by the use thereof in a process control system and by use in a component in which the method in accordance with the invention determines a partial-load condition of a system comprising several components by evaluating an energy model of at least one component of the system, by which a set of operating parameters of this component is allocated to at least one partial-load condition of this component, by evaluating specification parameters, which comprise specifications for a throughput of the system which is to be set, by determining a set of partial-load conditions of the system based on the at least one energy model, taking into account the specification parameters, and by simulating the set of partial-load conditions based on a parameterizable simulation model of the system.

The sequence of the first two method steps is essentially optional, such that the evaluation of the energy model and the evaluation of the specification parameters can also be effected in a sequence other than the disclosed sequence.

The invention is based on at least one energy model, which ideally although not necessarily is provided for almost every component of a system.

By application of the method in accordance with the invention, a system planner is placed in a position, by specifying specification parameters, such as a minimum throughput of the system or a maximum energy consumption, to obtain a set of partial-load conditions, i.e., a partial-load condition for each of the components involved in the determination. In this way, an individual partial-load condition can be adjusted for each component, where all partial-load conditions fulfill the provisions of the specification parameters.

Advantageously, the operating parameters of the energy model obtain a time duration that indicates the time required by a component for a change into a particular partial-load condition of the component or for a change from one particular partial-load condition into another.

In an advantageous embodiment of the invention, the operating parameters of the energy model contain an energy consumption of a particular partial-load condition of the component. Such a measure allows for an optimization of the system as a whole in respect of a partial-load condition in which the components operate on the condition of a desired throughput in the most energy-efficient manner possible.

In accordance with a further advantageous embodiment of the invention, the operating parameters also contain an energy consumption which is required for a change from, or for a change to, a particular partial-load condition of the component. In order to adjust a favorable energy consumption for the system, in this case dynamic aspects, which come into effect at a partial-load condition change of the system, are therefore also taken into account.

In a further advantageous embodiment of the invention, the operating parameters of the energy model contain data for the operation of the component in a particular partial-load condition. The data referred to, relating to the operation, are to be understood in this case to be primarily a component-related throughput, including an indication that, with a 50% partial-load operation, for example, of a motor, a 40% throughput in comparison with the full-load operation is to be anticipated. This factor takes account of the circumstance that a partial-load operation does not necessarily run in a linear manner with the throughput of the component related to it.

In another advantageous embodiment of the invention, the operating parameters contain values that contain an effect of a partial-load condition and of a change between particular partial-load conditions on the service life and on a required maintenance interval of the component. The presently contemplated embodiment guarantees that account is taken of the effects a change of partial-load conditions can have on an increase in maintenance intervals or on the service life of an individual component or of the system as a whole, respectively, which must be taken into account.

In a further advantageous embodiment of the method in accordance with the invention, the specification parameters comprise, as well as a throughput of the system which is to be set, specifications for an energy consumption of the system that is to be set. The energy consumption of a system, which in the past tended to play a subordinate role, is increasingly incurring a considerable amount of interest in the operational management planning of a system.

In an advantageous further embodiment of the method in accordance with the invention, a decentralized optimization method is provided for the determination of the set of partial-load conditions of the system. This optimization method is put into effect in particular with the use of market-based optimization methods.

In a further advantageous embodiment of the invention, the set of partial-load conditions obtained by simulation is revised by an iterative optimization method. This is performed by a repeated determination of a set of partial-load conditions with revised specification parameters and/or with at least one revised energy model. With such revision of a determination of partial-load conditions, consideration may also be given to replacing an existing component of a system by an alternative component, which is provided with an energy component that differs from the replaced component. The method in accordance with the presently contemplated embodiment can, if required, be run through repeatedly, in order to derive an optimized set of partial-load conditions of the system.

The determination in accordance with disclosed embodiments of the invention of the set of partial-load conditions of the system can be performed alternatively centralized or decentralized. In a central arrangement, the individual energy models of the components are transferred to a central system, for example, to a process control system (manufacturing execution system), in order to then perform a centralized determination. The centralized system can make use, for example, of data from an engineering tool.

In the case of a decentralized arrangement, the evaluation is divided over several components. This decentralized embodiment is advantageous in particular if every component has its own data processing possibility and communication unit.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment with further advantages and embodiments of the invention is explained in greater detail hereinafter on the basis of the drawings, in which.

DETAILED DESCRIPTION OF THE PREFERRED EMBODIMENTS

Figure 1:
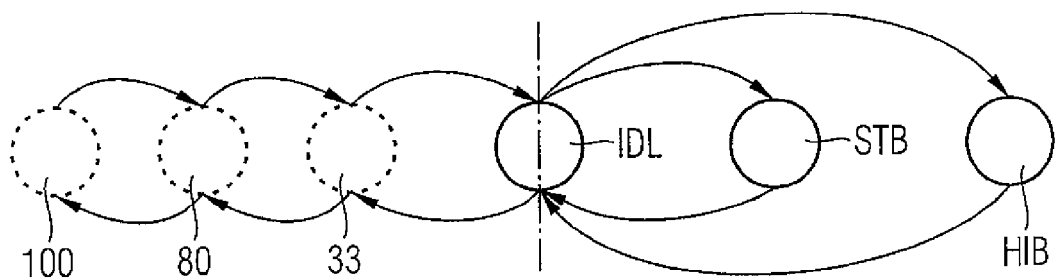
FIG. 1 is structure image for the schematic representation of an energy model of a component.

Shown in FIG. 1 is a schematic representation of an energy model of a component. By making use of the component-based energy model, an energy management on the component level is realized by the provision of operating conditions, in the drawing to the right of the broken line, and by the provision of partial-load conditions, in the drawing to the left of the broken line.

Represented in the right half of the energy model is a first operating condition IDL or "Idle" of the component. Represented in a circle which is arranged to the right of the first operating condition IDL, is a second operating condition STB or "Standby" of the component. Finally, a third operating condition HIB or "Hibernate" of the component is represented.

Each operating condition, HIB, IDL, STB, in the energy model is provided with a parameter quantity (not shown). Within this parameter quantity, for example, time periods can be defined, which indicate how long a particular operating condition can be maintained as a minimum or maximum, and a time duration which is necessary for a change from a first operational condition to a second operational condition.

The operational conditions HIB, IDL, STB represented in the right half model different conditions of rest of a component, which are provided, for example, from the Standard PROFIenergy for energy management of a component.

In contrast, definition of partial-load conditions, represented in the drawing to the left of the broken line, is not provided for in the present solutions. In other words, an indication is at present not accessible, as to whether a component, let alone a system, can change into a partial-load condition. Accordingly, at present there is also no possibility of determining in an automated manner different partial-load conditions as a function of the components used, and as a function of peripheral conditions, such as efficiency or throughput.

In accordance with the invention, the energy model of a component represented in FIG. 1 is extended by the partial-load conditions 33, 80, 100.

A first partial-load condition 33 contains, in a related parameter quantity, in addition to the parameters referred to above, also an item of information as to which operational condition is realized in the component in this first partial-load condition 33, which corresponds to a 33% utilization in proportion to a full load of the component.

The operating parameters that represent the operating behavior comprise in particular values, such as a throughput of the component in the first partial-load operation 33, as well as an energy consumption in this partial-load condition 33 and an energy consumption required for a change of condition.

For example, the data can be deposited for a drive unit that in the first partial-load condition 33, which corresponds to a 33% utilization of the drive, the reference speed of the drive is 3,000 revolutions per second. It can also be deposited in the operating parameters that the drive accelerates and brakes at 500 $s^{-2}$.

In advantageous embodiments, data can be deposited that define effects on maintenance intervals, wear, and service life of the corresponding component. These details further indicate that a frequent change between partial-load conditions can, from case to case, have negative effects on maintenance intervals or the service life of the component. A combination of all the operating parameters referred to is cited in the following energy model.

Represented in FIG. 1 is a partial-load condition 80, which corresponds to an 80% utilization of the component, as well as a third partial-load condition 100, which corresponds to a full load of the component, i.e. 100%.

Figure 2:
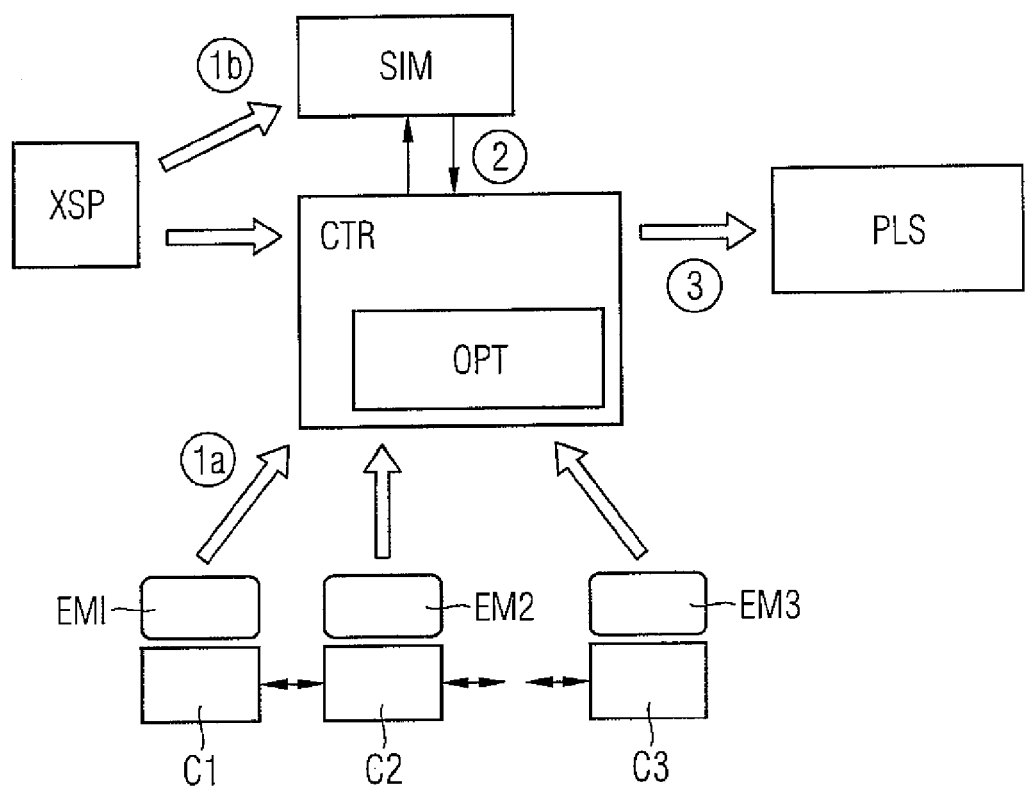
FIG. 2 is structure image for the schematic representation of a determination of a set of partial-load conditions.

FIG. 2 shows a structure image for the schematic representation of a determination of partial-load conditions of a system utilizing the method in accordance with the invention. Represented by way of example are three components C1, C2, C3 of the system, where an individual energy model EM1, EM2, EM3 is allocated to each individual component C1, C2, C3. The term "allocation" is to be understood to mean, on the one hand, a decentralized allocation, with which the energy models EM1, EM2, EM3 are retained, for example, in a memory area pertaining to the component. In the case of a centralized allocation, not represented, the energy models EM1, EM2, EM3 are retained centrally, for example, in a process databank.

The energy models EM1, EM2, EM3, or, more precisely, the operating parameters and partial-load condition parameters retained in the energy models EM1, EM2, EM3 are evaluated in a first step 1a. The energy models EM1, EM2, EM3 are preferably structured in a semantic description language.

In addition, external specifications XSP are evaluated in a second step 1b. As an external specification XSP, for example, a throughput is to be realized in the amount of 50% of the full-load operation of the system at minimum energy consumption. Maintenance and wear values can be defined as external specifications XSP.

The evaluation occurs, for example, in an optimization component OPT, performed by a control unit CTR. The embodiment referred to, making use of a central control unit CTR, can, if required, also be replaced by a decentralized evaluation (not shown) in which the individual components C1, C2, C3 perform the evaluation in a collaborative manner.

Based on the energy models EM1, EM2, EM3 and the external specifications XSP, a provisional set of partial-load conditions of the system is now determined in the optimization component OPT. In this optimization step, the optimization component OPT determines, for example, with the use of a decentralized optimization method, and in particular based on a market-based transaction, a partial-load condition of each component C1, C2, C3.

In a second method step 2, the provisional set of partial-load conditions of the system is conducted to a simulation component SIM, in which a simulation of the provisional set of partial-load conditions is performed based on a parameterizable simulation model of the system. This step serves to provide a verification of the set of partial-load conditions determined for the system based on real circumstances of the system. The simulation model of the system models the superordinated process of the system. The data exchange required for the simulation is taken over by the control component CTR. While the optimization concept OPT calculates all the permitted partial-load conditions based on the energy models EM1, EM2, EM3, the incorporation of the simulation component SIM restricts the partial-load conditions to the circumstances of the system, where account can also be taken of an initial or starting condition of the system.

This method step 2 is performed several times if required, by the two arrows represented in the drawing, where the result of the simulation, revised if required, is returned to the optimization component OPT, and the result of the stimulation undergoes a new optimization.

In this situation, the simulation result is evaluated again in the optimization component OPT, and, if appropriate, the optimization is restarted, in order to calculate a revised set of provisional partial-load conditions.

After at least one optimization and simulation step has been performed in this manner, if necessary in an iterative process, then, as the result, a set of partial-load conditions PLS of the system is provided in the method step 3.

The set of partial-load conditions contains the partial-load conditions that are to be set of at least one component C1, C2, C3 of the system, based on the partial-load condition of the system that is to be set by way of the external specifications XSP. For example, with a halved throughput of the system, as an external specification a partial-load condition of the conveyor belts can be derived of 40%, a partial-load condition of robots of 60%, a partial-load condition of the production control system of 90%, etc.

Figure 3:
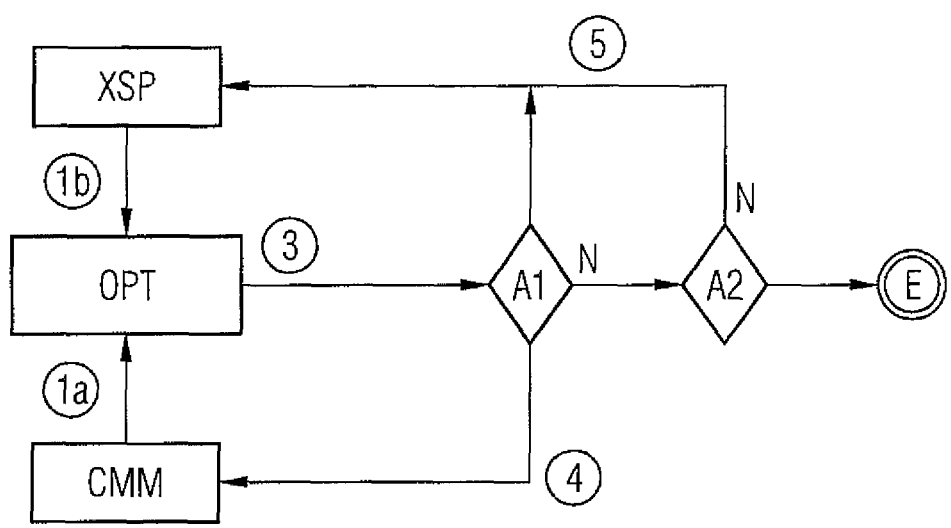
FIG. 3 is flow diagram for the schematic representation of a further optimization of a set of partial-load conditions.

The set of partial-load conditions PLS determined can be optionally checked by a system operator or planner, and again conducted to an optimization component OPT. Should the number of partial-load conditions or their values not be implementable, then, as represented in FIG. 3, either the external specifications XSP, corresponding to step 5, or components of the system, can be modified or exchanged, corresponding to step 4. With a modification or exchange of a component C1, the energy model EM1 allocated to the component C1 also changes. Accordingly, a CMM also changes, in FIG. 3 as a total quantity of the individual energy models EM1, EM2, EM3.

In a first branching A1 "Solution quantity empty?" of the sequence diagram depicted in FIG. 3, a check is first performed in a step 3 to determine whether, based on the external specifications XSP, which also include an arrangement of system equipment, a system layout, and an actuation of the system, and based on the total quantity CMM of the individual energy models EM1, EM2, EM3, a set of partial-load conditions PLS can in fact be determined at all by the optimization component OPT.

If the solution quantity is not empty, corresponding to the "No" branch, identified by N, of the first branching A1, then, in a second branching A2, "Solution acceptable?", a check is performed by the system operator or planner. In the opposite case, with an empty solution quantity, an adjustment according to step 5 is required, with a change of the external specifications, or, according to step 4, with the adjustment of the total quantity CMM of the individual energy models EM1, EM2, EM3. In step 4, no possible partial-load condition could be derived. As a consequence, either the external specifications or even the machine model must be changed, i.e., other machines must be used.

In a similar way, in the event of a negative result, corresponding to the "No" branch identified by N, an adjustment to the second branching A2 is performed, "Solution acceptable?", in accordance with step 5, with a change to the external specifications.

In step 5, partial-load conditions could be found but, to the knowledge of the system constructor, these are not acceptable. In this case, likewise, the external specifications (e.g., other throughput) can be adjusted. In this way, in an iterative manner, the best configuration can be found in the form of an optimum set of partial-load conditions, in accordance with method step E, "End".

While there have shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for determining a partial-load condition of a system comprising a plurality of components, the method comprising the steps of:
   evaluating an energy model of at least one component of the system to allocate a set of operating parameters of the at least one component to at least one partial-load condition of the at least one component of the system, the set of operating parameters containing an effect of a partial-load condition and of a change between particular partial-load conditions on the service life and on a required maintenance interval of the component;
   evaluating specification parameters comprising specifications for a throughput of the system which is to be set;
   determining a set of partial-load conditions of the system based on the energy model while taking into account the evaluated specification parameters;
   simulating the set of partial-load conditions based on a parameterizable simulation model of the system, said simulation including optimizing the system with respect to the partial-load condition of the system in which the at least one component operates in accordance with a desired throughput in an energy-efficient manner; using the set of partial-load conditions to adjust the at least one partial-load condition for the at least one component, wherein the set of partial load conditions fulfill the provisions of the specification parameters.

2. The method as claimed in claim 1, wherein the set of operating parameters of the energy model further contain a time duration for at least one of a change from a particular partial-load condition of the plurality of components and a change to the particular partial-load condition of the plurality of components.

3. The method as claimed in claim 1, wherein the set of operating parameters of the energy model further contains an energy consumption of a particular partial-load condition of the plurality of components.

4. The method as claimed in claim 1, wherein the set of operating parameters of the energy model further contains an energy consumption for a change from a particular partial-load condition of the plurality of components and a change to a particular partial-load condition of the plurality of components.

5. The method as claimed in claim 1, wherein the set of operating parameters of the energy model further contains data regarding an operation of the plurality of components in a particular partial-load condition.

6. The method as claimed in claim 5, wherein the operation comprises a throughput of the plurality of components in the particular partial-load condition.

7. The method as claimed in claim 1, wherein the specification parameters comprise specifications for an energy consumption of the system which is to be set.

8. The method as claimed in claim 1, wherein said step of determining the set of partial-load conditions of the system occurs based on a decentralized optimization.

9. The method as claimed in claim 8, wherein said step of determining the set of partial-load conditions of the system occurs utilizing market-based methods.

10. The method as claimed in claim 1, further comprising the step of:
    determining a new set of partial-load conditions with at least one of revised specification parameters and at least one revised energy model based on the simulated set of partial-load conditions.

11. The method as claimed in claim 10, wherein an optimized partial-load condition of the system is determined after at least one iteration of the method step of claim 10.

12. A process in which a process control system executes instructions set forth in a computer program executing on a processor which when used on the process control system cause the processor to determine a partial-load condition of the process control system, the computer program comprising:
    program code for evaluating an energy model of at least one component of the process control system to allocate a set of operating parameters of the at least one component to at least one partial-load condition of the at least one component of the process control system, the set of operating parameters containing an effect of a partial-load condition and of a change between particular partial-load conditions on a service life and on a required maintenance interval of the component;
    program code for evaluating specification parameters comprising specifications for a throughput of the process control system which is to be set;
    program code for determining a set of partial-load conditions of the process control system based on the energy model while taking into account the evaluated specification parameters; and
    program code for simulating the set of partial-load conditions based on a parameterizable simulation model of the process control system, said simulation including optimizing the process control system with respect to the partial-load condition of the process control system in which the at least one component operates in accordance with a desired throughput in an energy-efficient manner; using the set of partial-load conditions to adjust the at least one partial-load condition for the at least one component, wherein the set of partial load conditions fulfill the provisions of the specification parameters.

13. A process control system in a system implementing an optimized partial-load condition, wherein the process control system is configured to evaluate an energy model of at least one physical component of the system to allocate a set of operating parameters of the at least one physical component to at least one partial-load condition of the at least one physical component of the system, the set of operating parameters containing an effect of a partial-load condition and of a change between particular partial-load conditions on the service life and on a required maintenance interval of the component; evaluate specification parameters comprising specifications for a throughput of the system which is to be set; determine a set of partial-load conditions of the system based on the energy model while taking into account the evaluated specification parameters; and simulates the set of partial-load conditions based on a parameterizable simulatiion model of the system, said simulating including optimizing the system with respect to the partial-load condition of the system in which the at least one component operates in accordance with a desired throughput in an energy-efficient manner; using the set of partial-load conditions to adjust the at least one partial-load condition for the at least one component, wherein the set of partial load conditions fulfill the provisions of the specification parameters.

14. A robot of a manufacturing line in a system implementing an optimized partial-load condition, wherein the robot of the manufacturing line:

evaluates an energy model of at least one physical component of the system to allocate a set of operating parameters of the at least one component to at least one partial-load condition of the at least one physical component in the system, the set of operating parameters containing an effect of a partial-load condition and of a change between particular partial-load conditions on a service life and on a required maintenance interval of the component;

evaluates specification parameters comprising specifications for a throughput of the system which is to be set;

determines a set of partial-load conditions of the system based on the energy model while taking into account the evaluated specification parameters; and simulates the set of partial-load conditions based on a parameterizable simulation model of the system, said simulation including optimizing the system with respect to the partial-load condition of the system in which the at least one component operates in accordance with a desired throughput in an energy-efficient manner; uses the set of partial-load conditions to adjust the at least one partial-load condition for the at least one component, wherein the set of partial load conditions fulfill the provisions of the specification parameters.

* * * * *